(12) United States Patent
Chen

(10) Patent No.: US 6,998,890 B2
(45) Date of Patent: Feb. 14, 2006

(54) PROGRAMMABLE BANDWIDTH AND FREQUENCY SLEWING FOR PHASE-LOCK LOOP

(75) Inventor: Shyng Duan Chen, Kirkland, WA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/813,394

(22) Filed: Mar. 31, 2004

(65) Prior Publication Data

US 2005/0151593 A1    Jul. 14, 2005

Related U.S. Application Data

(60) Provisional application No. 60/536,398, filed on Jan. 14, 2004.

(51) Int. Cl.
*H03L 7/06* (2006.01)
(52) U.S. Cl. .................. 327/157; 327/156; 331/16
(58) Field of Classification Search ........ 327/156–157, 327/147–148; 331/16–17, 1 A
See application file for complete search history.

(56) References Cited

U.S. PATENT DOCUMENTS

| | | | | |
|---|---|---|---|---|
| 5,343,169 A | * | 8/1994 | Debaty | 331/17 |
| 5,475,326 A | * | 12/1995 | Masuda | 327/157 |
| 5,699,020 A | * | 12/1997 | Jefferson | 331/17 |
| 5,822,387 A | | 10/1998 | Mar | |
| 6,215,361 B1 | * | 4/2001 | Lebouleux et al. | 331/17 |
| 6,222,745 B1 | | 4/2001 | Amaro et al. | |
| 6,853,252 B1 | | 2/2005 | Dickmann | |
| 2003/0185329 A1 | | 10/2003 | Dickmann | |

FOREIGN PATENT DOCUMENTS

| | | |
|---|---|---|
| EP | 0 564 377 A1 | 10/1993 |
| EP | 0 899 883 A1 | 3/1999 |

OTHER PUBLICATIONS

International Search Report for PCT/US 03/31316 dated Apr. 20, 2004.

* cited by examiner

*Primary Examiner*—Dinh T. Le
(74) *Attorney, Agent, or Firm*—Graybeal Jackson Haley LLP

(57) ABSTRACT

A phase-lock loop which includes an oscillator having an oscillator signal whose frequency is related to a received error correction signal and phase-frequency detector receiving and comparing the oscillator signal and a reference signal from the master circuit and generating the error correction signal based on the phase difference of the oscillator signal and the reference signal. A first window circuit counts the number of comparing cycles of the detector and provides a first window signal for the transmission of the error correction signals from the detector to the oscillator at a frequency of a predetermined number of counted comparing cycles. A second window circuit which, in response to at least the oscillator signal, narrows the first window signal to limit the duration of the correction signal for irregular reference signals.

26 Claims, 7 Drawing Sheets

PROGRAMMABLE BANDWIDTH AND FREQUENCY SLEWING FOR PHASE-LOCK LOOP

CROSS-REFERENCE

This application claims the benefit of U.S. Provisional Application No. 60/536,398, filed Jan. 14, 2004; is related to U.S. application Ser. No. 10/264,360 entitled PHASE-LOCK LOOP HAVING PROGRAMMABLE BANDWIDTH and U.S. application Ser. No. 10/264,359 entitled PWM CONTROLLER WITH INTEGRATED PLL, both of which were filed on Oct. 4, 2002; and all of which are hereby incorporated by reference.

BACKGROUND OF THE INVENTION

A graphics board is a printed-circuit board that typically includes at least one graphics processor and other electronic components that process and display graphics or other video data in a computer system. FIG. 1 is a block diagram of a graphics board 100 that includes a graphics processor 105, as discussed in the aforementioned U.S. applications. Typically, one of the electronic components connected to the graphics processor 105 is a double-data-rate random-access memory (DDS RAM) chip 106. Both the graphics processor 105 and the DDR RAM 106 typically have high power requirements, as compared to other electronic components. For example, the graphics processor 105 typically requires 5–15 amps (A) of power at 1.6 volts (V), and the DDR RAM 106 typically 5–10 A and 10–20 A at 1.25 V and 2.5 V, respectively. Because the processor 105 and DDR RAM 106 have such high power requirements, pulse-width-modulated (PWM) switching power supplies 110a, 110b, and 110c are typically provided for the graphics processor 105 and the DDR RAM 106. A common power supply 108 feed the PWM switching power supplies 110a, 110b and 110c. Typically, the PWM power supplies 110a, 110b and 110c each includes a separate PWM-controller chip 112a, 112b and 112c, although these controllers can be integrated into the graphics processor 105 and DDR RAM 106 chips, respectively.

Ideally, the operating frequencies of the PWM power supplies 110a, 110b and 110c are the same. If, however, these frequencies are different, undesirable "beat" frequencies can result. A beat frequency is equal to the difference between the two frequencies. Unfortunately, the beat frequency can cause undesirable artifacts to appear in a video display.

A technique for reducing or eliminating the beat frequency is for two of the PWM controllers 112b and 112c (slaves) of the graphics board 105 to lock onto the PWM signal of the other PWM controller 112a (master) using a phase-lock loop (PLL). The slave PLLs can each generate one or more slave-PWM output signals that are phase locked to the master-PWM signal and that have the same frequency as the master-PWM signal.

As illustrated in FIG. 2, the master-PWM controller 112a provides output signals UG and LG to driver 120a, which provides a signal to integrator 122a. The output of the integrator 122a is V1. The master-PWM controller 112a also has signal LG connected as the input to a slave-PWM 112b. The output signals UG and LG of the slave-PWM 112b are provided to driver 120b, which provides a signal to integrator 122b. The output signal is V2. The slave-PWMs have a tendency to overcorrect if there are disturbances on the input signal. In other systems wherein the input signals to the PWM controllers are a crystal oscillator, there are no missed pulses. However, in PWM master/slave applications, there are missed pulses if the load current is stepped. If there are few missing pulses, it is possible that either the up or down pulses in the pulse width in the PLL will be very wide and drive the voltage control oscillator (VCO) to follow.

An example of this type of PLL is illustrated in FIG. 3 and disclosed in detail in the aforementioned U.S. applications. The input or reference signal IN2 at 202 is provided to a phase frequency detector (PFD) 200. The input signal 202 is compared against a feedback signal 204 coming from VCO 206. Depending upon the frequency difference, an up signal UP 208 or a down signal DN 210 is provided through a switching, gate or logic circuit 212 as UPG and DNG to a charge pump 220. The output of the charge pump 220 is provided through a filter 226 to the VCO 206. The output of VCO 206 is the output signal IN1 at 234, as well as feedback signal 204. A÷N counter 218 is responsive to the cycles of the PFD 220 to transmit the up/down signals on 208 and 210 through the gate circuit 212 to operate the charge pump 220. In the above-mentioned applications, the circuit 212 is shown as gated inverters, as well as multiplexes. In FIG. 3, they are illustrated by AND gates 214, 216. It should also be noted that the filter 226 has capacitor 228 in parallel with the series connection resistor 232 and capacitor 230. ÷N counter 218 is a decrementing counter and maintains a transmission signal having a width of a cycle of the PFD 220. It is the width of this signal through the circuit 212 which causes the overcorrection for the instability in the input signal at 202.

SUMMARY OF THE INVENTION

One embodiment is a PLL which includes an oscillator having an oscillator signal whose frequency is related to a received error correction signal and PFD receiving and comparing the oscillator signal and a reference signal from a master circuit and generating the error correction signal based on the phase difference of the oscillator signal and the reference signal. A first window circuit counts the number of comparing cycles of the detector and provides a first window signal for the transmission of the error correction signals from the detector to the oscillator at a frequency of a predetermined number of counted comparing cycles. A second window circuit which, in response to at least the oscillator signal, narrows the first window signal to limit the duration of the correction signal for irregular reference signals.

The second window circuit may include a delayed path delayed with respect to a generally non-delayed path for the respective signal and a first logic circuit responsive to the delayed and non-delayed signals to produce the second window signal which narrows the first window signal. A second logic circuit responsive to the first and second window signals to transmit the error correction signals from the detector to the oscillator may also be provided. The PLL may include a rate selector circuit, which monitors and adjusts the predetermined number of counts as a function of the error correction signal.

The PLL may be provided in a slave-PWM controller of a pulse width modulated system wherein the reference signal is from the master-PWM controller, and the oscillator proves a PWM signal. Also, the pulse width modulation system may be part of a power supply circuit having master and slave power supplies. The power supply may be part of a video processor, which may be part of a computer system. The PLL may be provided in a transmitter/receiver.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1:
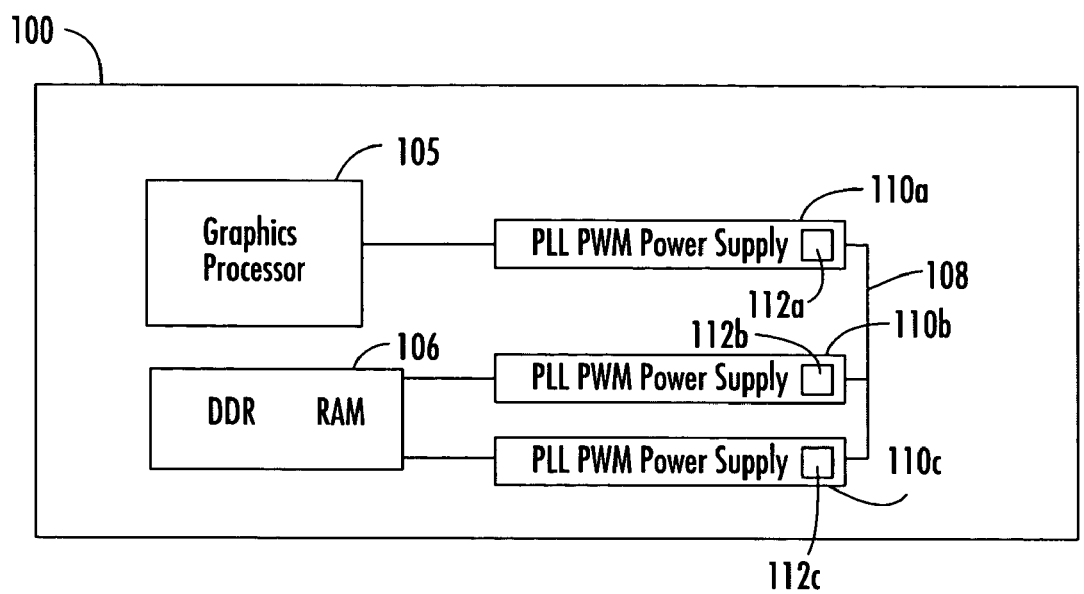
FIG. 1 is a block diagram of a graphic board that utilizes an embodiment of a PWM controller according to an embodiment of the present disclosure.
Figure 2:
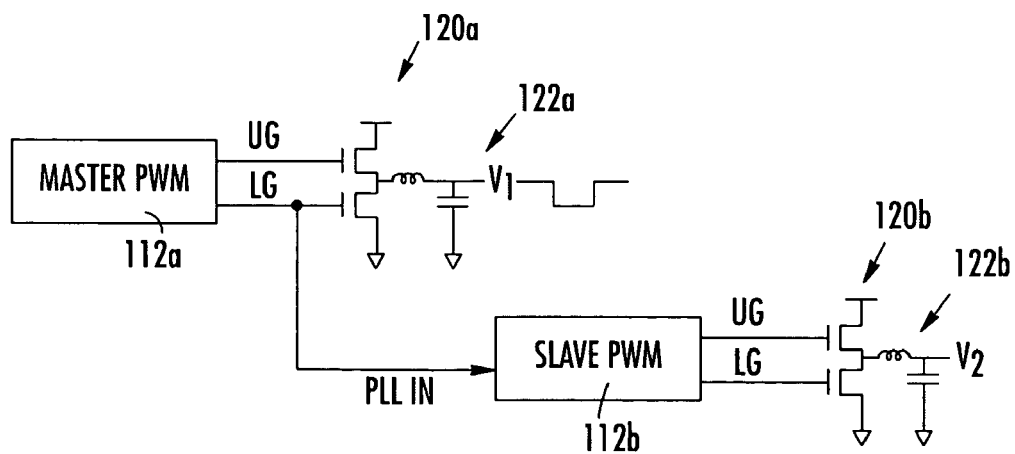
FIG. 2 is a schematic of a master/slave PWM controller.
Figure 4:
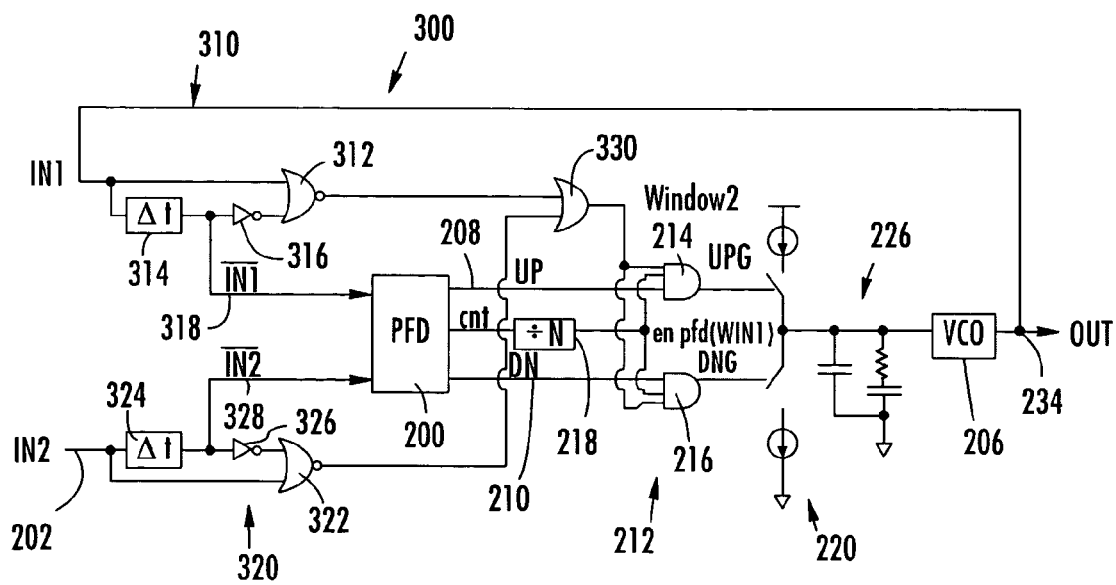
FIG. 4 is a schematic of a PLL incorporating the principles of the present disclosure.
Figure 6:
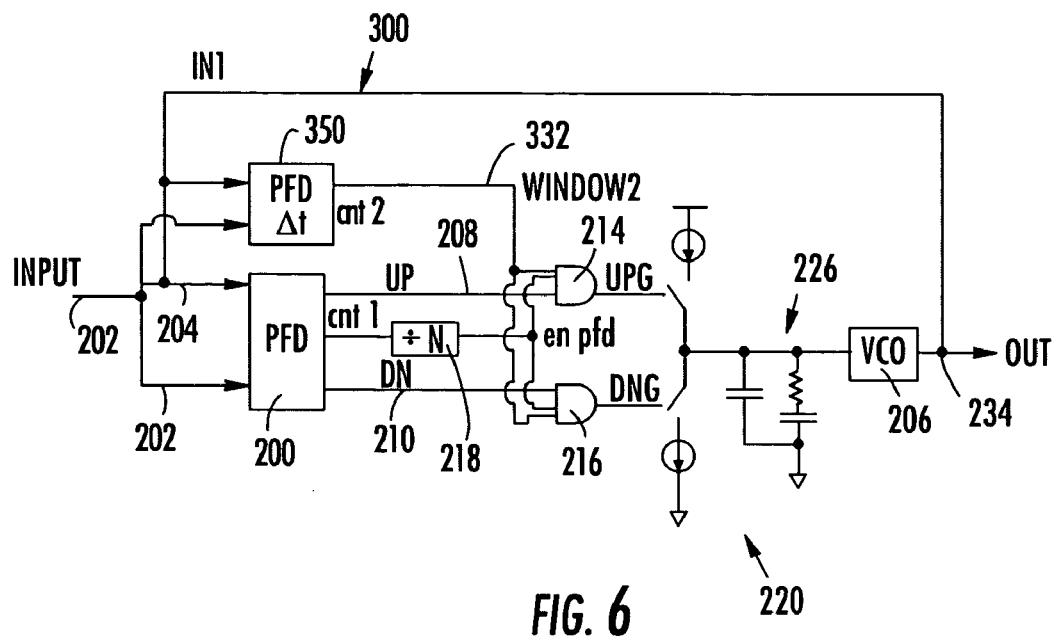
FIG. 6 is another embodiment of PLL incorporating the principles of the present disclosure to accommodate fluctuations in the input signal.
Figure 7:
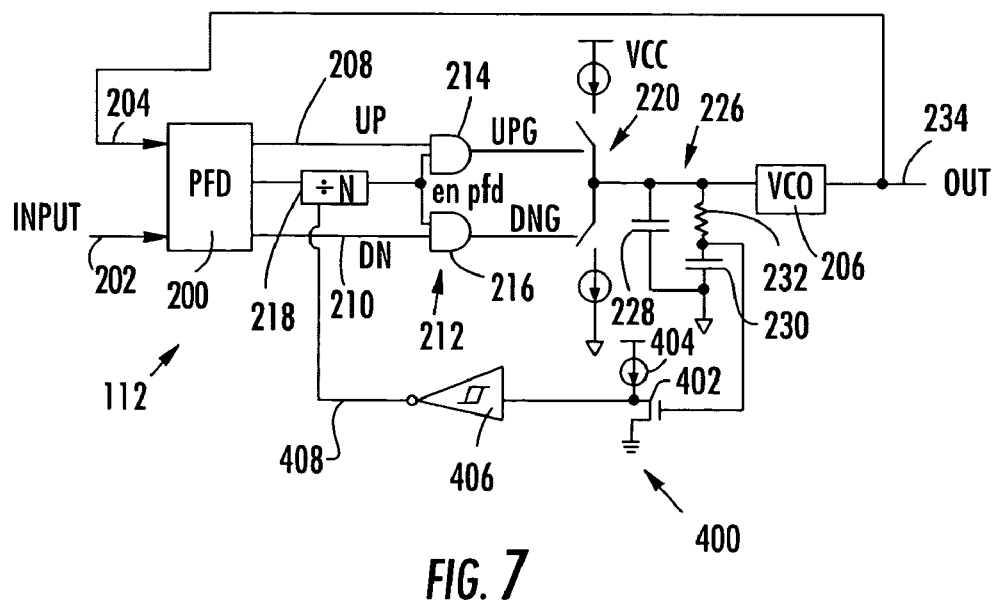
FIG. 7 is a block diagram of an even further embodiment of the PLL, according to the present disclosure, with a variable rate of the transmission of the correction signal.
Figure 8:
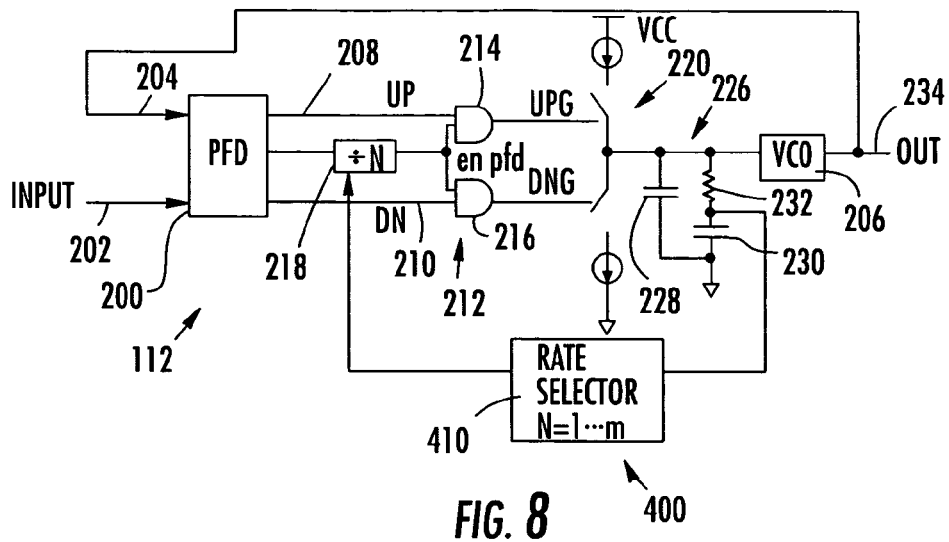
FIG. 8 is an even further embodiment of the PLL, according to the present disclosure, showing a further variable rate of transmission of the correction signal.
Figure 9:
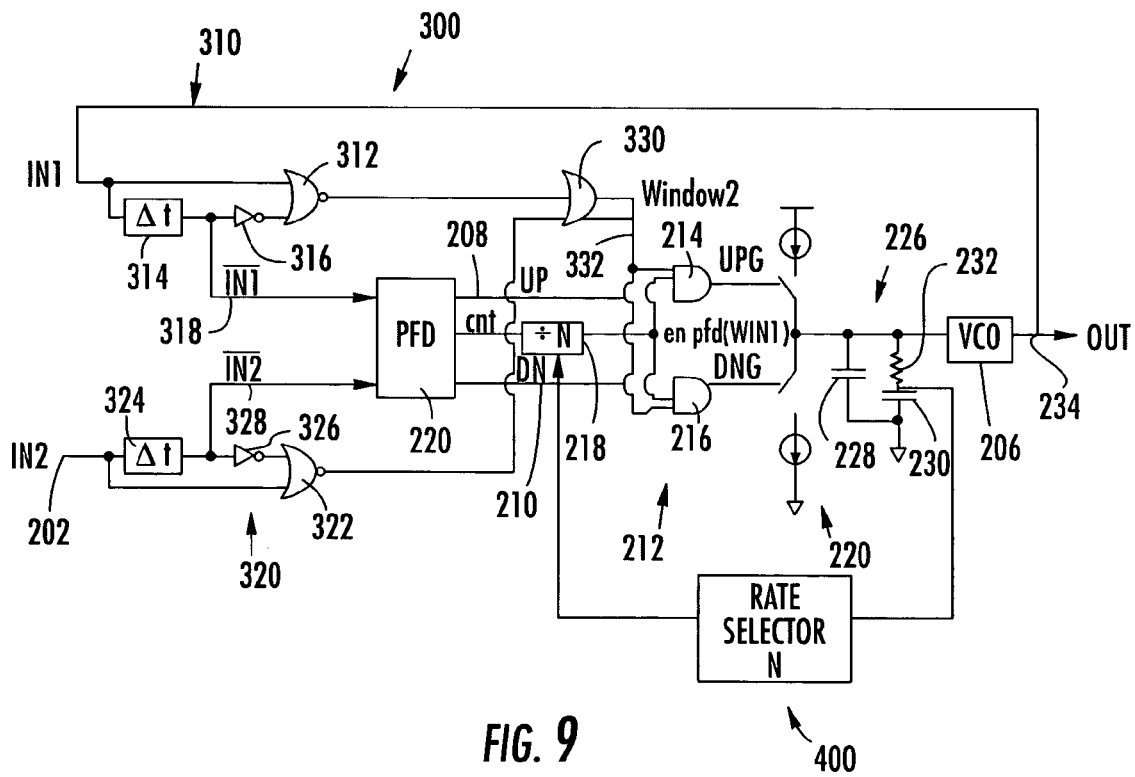
FIG. 9 is a schematic of a PLL incorporating the embodiments of FIG. 4 and FIG. 7 or FIG. 4 and FIG. 8.
Figure 10:
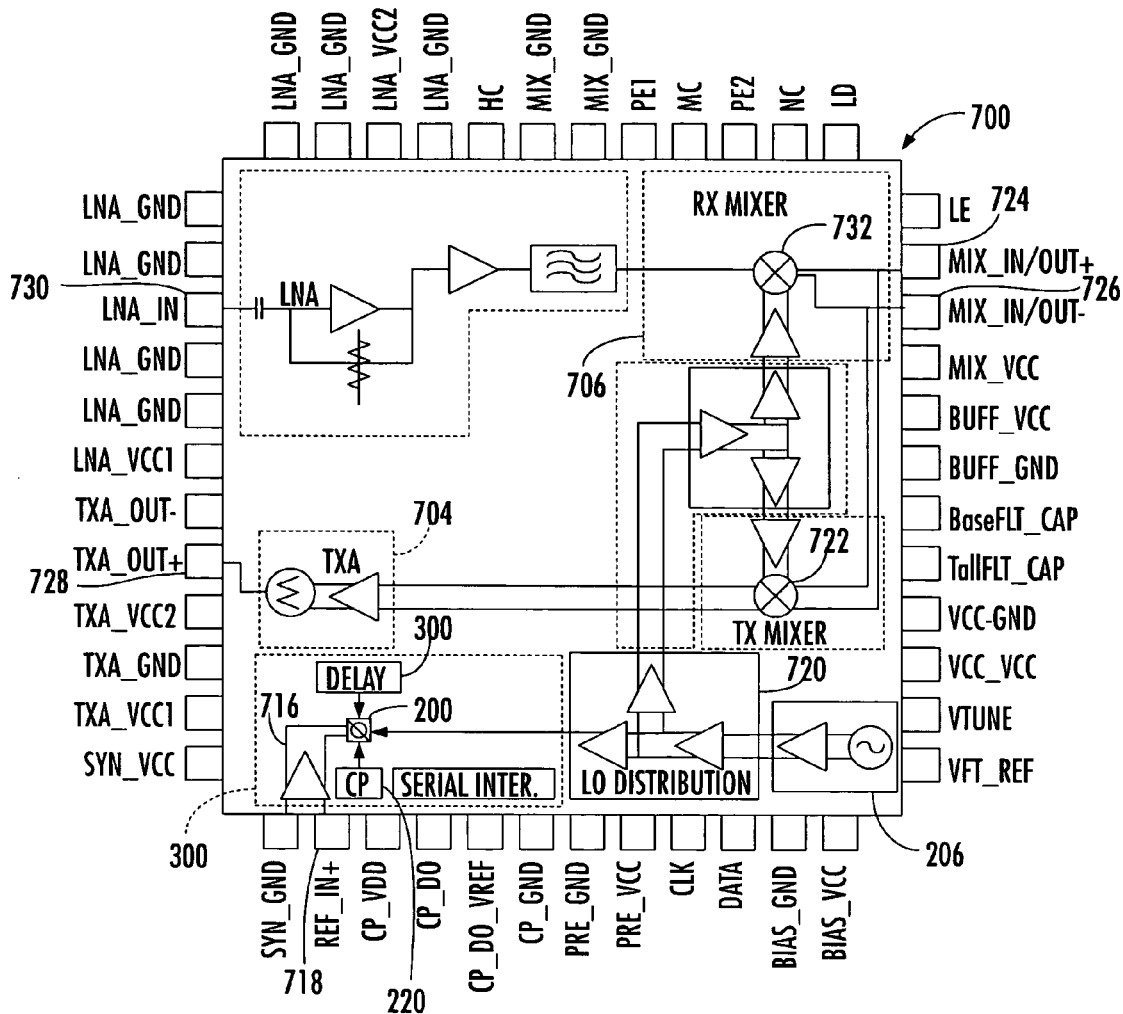
FIG. 10 is a diagram of a Wireless-Area-Network (WAN) transmitter/receiver that can incorporate the PLL of the present disclosure.
Figure 11:
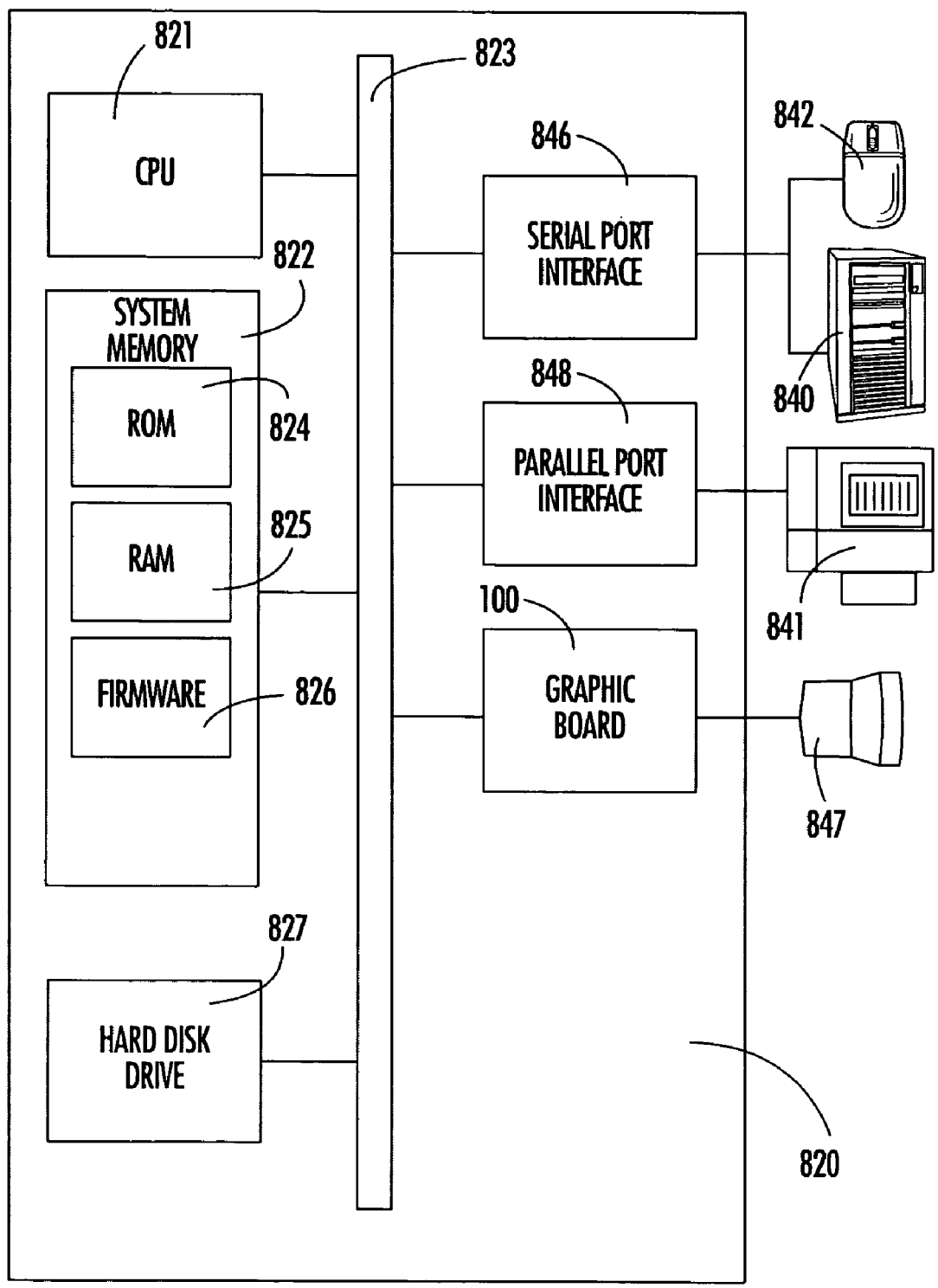
FIG. 11 is a block diagram of a computer that incorporates the graphic board of FIG. 1 with one of the PLLs of the present disclosure.

The PLLs of the present disclosure may be used in the graphic card 100 of FIG. 1, the slave PWM controller 112b of FIG. 2, the WAN transmitter/receiver of FIG. 10 or the computer of FIG. 11. They may also be used in other devices requiring a PLL. FIGS. 4 and 6 show embodiments of a PLL wherein the width of the correction pulse is limited. This prevents the irregularity of the reference or input signal from causing a locked loop to start corrections or an unlocked loop to overcorrect. The embodiments of FIGS. 7 and 8 are PLLs with a variable rate of transmission of the correction signal. FIG. 9 is a combination of the embodiments having a limited duration of the correction signal and a variable rate of transmission.

Figure 3:
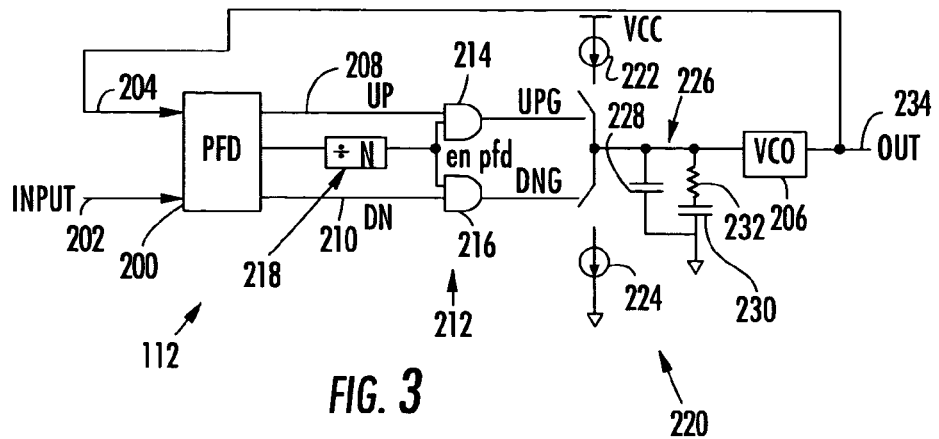
FIG. 3 is a schematic of a type of PLL to which the present disclosure is directed.

Those elements of the PLL which are common to that shown of FIG. 3 will have the same reference numbers and function the same way as those elements in FIG. 3. The operation of the PLL including the phase frequency detector (PFD) 200, the counter 218, the logic transmission circuit 212, the charge pump 220, the filter 226 and the VCO 206 are well known and will not be described in detail. Reference will be made to the aforementioned applications, as well as other prior art devices.

As previously described with respect to FIG. 3, the frequency of the correction pulses UPG and DNG are defined by the period in which the output of the counter 218 activates the gates 214 and 216 and transmits the signal to the charge pump 220. This frequency is a function of the frequency of the input signal 202 and the feedback signal 234 at input 204. The present system offers a second window circuit 300, which is applied to the gating or transmission circuit 212 to limit the width of the first window en_pfd WIN1 from the counter 218 to the width of the second window WIN2 produced by the second window circuit 300.

The first embodiment of the second window circuit 300 is illustrated in FIG. 4. The window circuit 300 includes a first second window circuit 310. The oscillator output signal IN1 at output 234 is provided through feedback as a first input to NOR gate 312. The other input to NOR gate 312 is the signal IN1 through a time delay circuit 314 and inverter 316. The output of the NOR gate 312 is a pulse having a width of the time delay 314. The time delayed feedback signal is also provided to the PFD 220 as signal $\overline{IN1}$ on 318. A second second window circuit 320 provides a signal in response to the reference or input signal IN2 at input 202. Input signal 202 is provided to a NOR gate 322, whose other input is the input signal IN2 through time delay circuit 324 and inverter 326. The input signal IN2 at 202 through time delay 324 is also provided as the reference input signal $\overline{IN2}$ on 328 to the PFD 220.

The output of NOR gates 312, 322 are provided to OR gate 330. The output of OR gate 330 is a window 2 signal WIN2, which is provided to each of the AND gates 214 and 216 to be combined with the up or down correct signals UP, DN on 208 or 210 and the output of the counter circuit 218, which is enable-PFD or window 1 (WIN1). Thus, for example, if counter 218 is set for 16, on every 16$^{th}$ pulse, the window 1 signal will be high for a period between the count signals cnt. The AND gates 214, 216 will not transmit the up/down signals, even though counter 218 is high, until it receives the second window signal window 2 from OR gate 330. The length of transmission through the gates 214, 216 is a function of the width of the second window signal window 2, which is equal to the time delay Δt of the time delay circuits 314 or 324.

Although the second window signal window 2 is responsive to either the feedback or oscillator signal IN1 or the input signal IN2 and both are shown in FIG. 4, not both signals are needed. The feedback or oscillator signal IN1 alone may be used. The use of the feedback signal IN1 allows the gating of the gates 214, 216 for erratic input signals IN2 at input 202. As previously discussed, the count signal out of the PFD 220 to counter 218 is once per comparison cycle. Also, the window 2 pulse is once per cycle.

Since the pulse width of window 2 is defined merely by a time delay 314 or 324, it does not vary based on the change of frequency of the input signal or the frequency of the VCO 206. It should also be noted that, with the specific structure shown, the PLL works on the falling edge of the signals.

Figure 5:
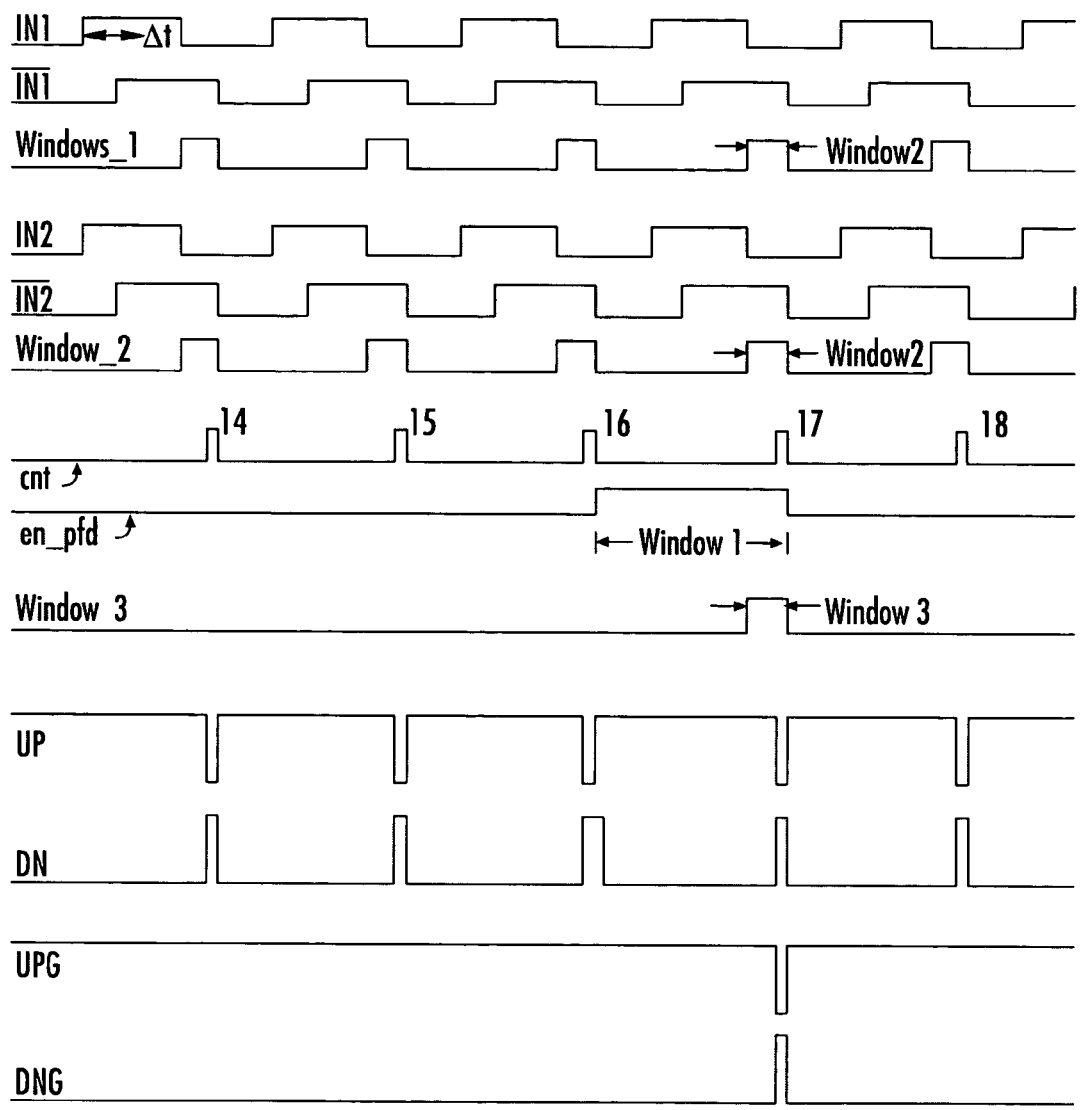
FIG. 5 shows graphs of signals at various points in the PLL of FIG. 4 for a locked condition of the loop.

FIG. 5 shows graphs of the various signals in the PLL of FIG. 4. The first three graphs show the relationship of the oscillator signal IN1, the window 2 signal of the window 2 loop 310 and the oscillator input signal $\overline{IN1}$ into the PFD 220. The next three graphs show the relationship between the reference or input signal IN2, the delayed input signal $\overline{IN2}$ to the PFD 220 and the window 2 signal from the window 2 circuit 320. The next two graphs show the count signals cnt coming out of the PFD 220 and the window 1 signal en_pfd on output of the counter 218. For this example, N is set equal to 16. The next graph shows window 3, which is the combination gating signal of windows 1 and 2. The next four graphs show the up/down correction signals UP, DN for a locked condition on lines 208, 210 from the PFD 220 and the resulting up gate and down gate signals UPG, DNG at the output of gates 214 and 216, respectively.

By way of example, the window 1 or the frequency between cycles is in the range of 0.5 to 3.33 microseconds. This is a function of the frequency of the input signal 202. The width of window 2 (and, consequently, window 3) is in the range of 0.1 to 0.5 microseconds and preferably is under 0.5 microseconds. Thus, the correction cycle is limited. The time delay circuits 314, 324 may be changed to define the window 3 width. The PLL has been designed to have inertia such that it does not quickly change to overcompensate. This minimizes the effect of irregular reference signals. This irregularity either being missing cycles or a varying in frequency.

Another embodiment to create the window 2 signal is illustrated in FIG. 6. A second PFD 350 is provided as the second window circuit 300. The input signal 202 and the oscillator signal at 234 are provided to the PFD 350. PFD 350 has an internal time delay Δt, which is greater than any time delay in PFD 200. All circuits include inherent time delay. Thus, the time through PFD 350 is delayed relative to the path through PFD 200. Since a single second window pulse is required per cycle, the count pulse cnt 2 at PFD 350 is inputted into the AND gates 214, 216. As is well known, the count pulse in a PFD is the output of an AND gate for both an up and down corrections. Even when the PLL is in sync or locked, there are up and down signals. Thus, as an alternative, if a PFD does not include a count circuit, the up and down output out of the second PFD 350 could be combined in an AND gate and provided as a signal 332 to the AND gates 214, 216. It should be noted that the time delay within the PFD 350 may be provided by additional pairs of inverters. The same would hold true for the time delay circuits 314, 324 of FIG. 4. Other well-known time delay circuits or elements may be used.

Although the up/down counter 218 has been described in the aforementioned applications as a decrementing counter 218 for the frequency divider, it can also be an incrementing counter for the frequency divider.

Another improvement to the PLL, as illustrated in FIGS. 7 and 8, is to change the transmission rate or frequency of the first window. This allows the system to respond differently during start-up and non-lock and during lock. Thus, it is basically changing the bandwidth of the response of the PLL. A rate selector circuit 400, as illustrated in FIG. 7, monitors the charge on capacitor 230 of the filter 226. The amount of charge on capacitor 230 is a function of the operation of the charge pump circuit 220. The rate selector circuit 400 includes a switch or MOS FET 402, which senses the voltage at capacitor 230. Connected to the source of MOS FET 402 is a current source 404. Once the voltage of the capacitor 230 exceeds the threshold of the MOS FET 402, it sends an enabling signal through Schmitt trigger 406 to the counter 218. Prior to this point, counter 218 is disabled or has a count of one and, therefore, for each cycle, an enable pulse is transmitted through to the logic gates 214, 216. Thus, for every cycle, the up and down pulses UP, DN on 208 and 210 are transmitted through as signals UPG and DNG. Thus, initially, the PLL will have a correction every comparison cycle. Once the system gets closer to lock, the voltage on the capacitor 230 is maintained high and, therefore, the counter 218 will slow down the correction frequency by the comparison cycle divided by N. By way of example, whereas the time for lock of a 300 kHz signal using the circuit of FIG. 3 and N=16 is 10 milliseconds, with a selector circuit 400, the lock time has been decreased to the range of 2.5 milliseconds.

FIG. 8 shows another embodiment of the rate selector 400. In this case, the rate selector 410 has more than one adjustment value, wherein N may be 1 to M cycles. The rate selector 410 may be a state machine which senses various levels of voltage on the capacitor 230 and sets the appropriate rate to the counter 218. For example, using a count of 16, the various levels or thresholds may set a count of 2, 4, 8, 12, 16. Alternatively, the state machine, after reading a first threshold, may incrementally or sequentially increase the count of counter 218. Thus, the lock process may be initially sped up to get to lock faster and then slowed down to maintain lock. Thus, the PLLs of FIGS. 7 and 8 are variable bandwidth PLLs.

The combination of the two improvements of the PLL is illustrated in FIG. 9. The second window circuit 300 of FIG. 4 is combined with the rate selector 400 of FIG. 7 or FIG. 8. Thus, the PLL of FIG. 9 not only has a variable bandwidth with speed-up of the initial phase of the loop, but it also includes a narrow transmission or correction window to accommodate for variations in the input or reference signal.

FIG. 10 is a WAN transmitter/receiver 700 that can incorporate any of the PLLs of FIGS. 4, 5 and 6–9, according to an embodiment of the invention. In addition to the PFD 200, charge pump 220, VCO 206, frequency divider 218 (omitted from FIG. 10 for clarity), window 2 circuit 300 and the filter 226 (omitted from FIG. 10 for clarity), the PLL includes a terminal 718 for receiving the reference signal and a local-oscillator (LO) distributor 720 for distributing the output of the VCO 206 as an LO signal. In addition to the PLL, the transmitter/receiver 700 includes a transmitter 704 and a receiver 706. The transmitter 704 includes a mixer 722 that modulates the LO with a differential base-band data signal received from a computer (not shown) via data terminals 724, 762. The transmitter 704 then provides this modulated data signal to a transmit-terminal 728 for wireless transmission to a remote receiver (not shown). Similarly, the receiver 706 receives a modulated data signal from a remote wireless transmitter (not shown) via a terminal 730, and includes a mixer 732 that demodulates the received data signal with the LO signal and provides a differential demodulated data signal to the computer via the terminals 724 and 726. The PLL is operable to synchronize the LO signal from the VCO 206 to the reference signal received on terminal 718. The transmitter/receiver 700 also includes other circuits that are conventional and that are thus omitted from FIG. 10 for brevity.

FIG. 11 is a block diagram of a general-purpose computer system 820 that incorporates the graphics board 100 of FIG. 1, according to an embodiment of the invention. The computer system 820 (e.g., personal or server) includes one or more processing units 821, system memory 822, and a system bus 823. The system bus 823 couples the various system components including the system memory 822 to the processing unit 821. The system bus 823 may be any of several types of busses (including a memory bus, a peripheral bus and a local bus) using any of a variety of bus architectures. The system memory 822 typically includes read-only memory (ROM) 824 and random-access memory (RAM) 825. Firmware 826 containing the basic routines that help to transfer information between elements within the computer system 820 is also contained within the system memory 822. The computer system 820 may further include a hard disk-drive system 827 that is also connected to the system bus 823. Additionally, optical drives (not shown), CD-ROM drives (not shown), floppy drives (not shown) may be connected to the system bus 823 through respective drive controllers (not shown) as well.

A user may enter commands and information into the computer system 820 through input devices such as a keyboard 840 and pointing device 842. These input devices, as well as others not shown, are typically connected to the system bus 823 through a serial port interface 846. Other interfaces (not shown) include Universal Serial Bus (USB) and parallel ports 840. A monitor 847 or other type of display device may also be connected to the system bus 823 via an interface such as the graphics card 100.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed is:

1. A phase-lock loop comprising:
   an oscillator having an oscillator signal whose frequency is related to a received error correction signal;
   a phase-frequency detector receiving and comparing the oscillator signal and a reference signal from a master circuit, and generating the error correction signal received by the oscillator based on a phase difference of the oscillator signal and the reference signal;
   a first window circuit coupled to the detector and operable to counts a number of comparing cycles of the detector and provides a first window signal for a transmission of the error correction signals from the detector to the oscillator at a frequency of a predetermined number of counted comparing cycles; and
   a second window circuit coupled to the detector and, in response to at least the oscillator signal, operable to narrows the first window signal to limit a duration of the error correction signal for irregular reference signals.

2. The phase-lock loop according to claim 1, wherein the second window circuit is responsive to both the oscillator signal and the reference signal.

3. The phase-lock loop according to claim 2, wherein the second window circuit includes, for each of the oscillator signal and the reference signal, a delayed path delayed with respect to a generally non-delayed path and a first logic circuit responsive to signals on the delayed and the generally non-delayed paths to produce a second window signal which narrows the first window signal.

4. The phase-lock loop according to claim 3, wherein the delayed paths provide the oscillator signal and reference signal to the detector for comparing.

5. The phase-lock loop according to claim 3, including a second logic circuit responsive to the first and second window signals to transmit the error correction signals from the detector to the oscillator.

6. The phase-lock loop according to claim 3, wherein the delayed paths each include an inverter.

7. The phase-lock loop according to claim 1, wherein the second window circuit includes a delayed path delayed with respect to a generally non-delayed path for at least the oscillator signal and a first logic circuit responsive to signals on the delayed and non-delayed paths to produce a second window signal which narrows the first window signal.

8. The phase-lock loop according to claim 7, including a second logic circuit responsive to the first and second window signals to transmit the error correction signals from the detector to the oscillator.

9. The phase-lock loop according to claim 7, wherein the delayed path includes an inverter.

10. The phase-lock loop according to claim 1, including a charge pump between the detector and the oscillator; the detector provides the error correction signal as an up or a down signal on separate paths; and the first and second window circuits control the transmission of the up and down signals to the charge pump.

11. The phase-lock loop according to claim 1, including a rate selector circuit coupled to the first window circuit and operable to monitors and adjusts the predetermined number of counted comparing cycles as a function of the error correction signal.

12. A pulse width modulation controller including a phase-lock loop according to claim 1; and wherein the reference signal is a master PWM signal, and the oscillator signal is a slave PWM signal of the controller.

13. A power supply circuit comprising:
    a main power supply;
    master PWM power supply that generates a first regulated supply voltage and a master PWM signal; and
    a slave PWM power supply that receives the master PWM signal and generates a second regulated supply voltage and includes a phase-lock loop; and
    wherein the phase-lock loop is according to claim 1 and wherein the reference signal is the master PWM signal and the oscillator signal is a slave PWM signal used to regulate the second regulated supply voltage.

14. A transmitter/receiver comprising:
    a receiver circuit which generates a received base-band data signal from a modulated received signal and a local oscillator signal;
    a transmitter circuit which generates a modulated transmission signal from a transmission base-band data signal and a local oscillator signal; and
    a phase-lock loop coupled to the receiver and transmitter circuits; and
    wherein the phase-lock loop is according to claim 1.

15. A computer system comprising:
    a central processing unit connected to a bus system;
    a video processor connected to the bus system, controlled by the central processing unit and including a power supply circuit;
    a display device connected to the video processor; and
    wherein the power supply circuit is according to claim 13.

16. A pulse width modulated system having a master and a slave controller, the slave controller having a phase-lock loop which comprises:
    an oscillator having a PWM signal whose frequency is related to a received error correction signal;
    a phase-frequency detector receiving and comparing the PWM signal and a reference signal from the master controller, and generating the error correction signal received by the oscillator based on a phase difference of the oscillator signal and the reference signal;
    a first window circuit coupled to the detector and operable to counts a number of comparing cycles of the detector and provides a first window signal for a transmission of the error correction signals from the detector to the oscillator at a frequency of a predetermined number of counted comparing cycles; and
    a second window circuit coupled to the detector and, in response to at least the PWM signal, operable to narrow the first window signal to limit a duration of the error correction signal for irregular reference signals from the master controller.

17. The system according to claim 16, wherein the second window circuit is responsive to both the PWM signal and the reference signal.

18. The system according to claim 17, wherein the second window circuit includes, for each of the PWM signal and the reference signal, a delayed path delayed with respect to a generally non-delayed path and a first logic circuit responsive to signals on the delayed and non-delayed paths to produce a second window signal which narrows the first window signal.

19. The system according to claim 18, wherein the delayed paths provide the PWM signal and reference signal to the detector for comparing.

20. The system according to claim 18, including a second logic circuit responsive to the first and second window signals to transmit the error correction signals from the detector to the oscillator.

21. The system according to claim 18, wherein the delayed paths each include an inverter.

22. The system according to claim 16, wherein the second window circuit includes a delayed path delayed with respect to a generally non-delayed path for at least the PWM signal and a first logic circuit responsive to signals on the delayed and non-delayed paths to produce a second window signal which narrows the first window signal.

23. The system according to claim 22, including a second logic circuit responsive to the first and second window signals to transmit the error correction signals from the detector to the oscillator.

24. The system according to claim 22, wherein the delayed path includes an inverter.

25. The system according to claim 16, including a charge pump between the detector and the oscillator; the detector provides the error correction signals as an up or a down signals on separate paths; and the first and second window circuits control the transmission of the up and down signals to the charge pump.

26. The system according to claim 16, including a rate selector circuit coupled to the first window circuit and operable to monitor and adjust the predetermined number of counted comparing cycles as a function of the error correction signal.

* * * * *

UNITED STATES PATENT AND TRADEMARK OFFICE
CERTIFICATE OF CORRECTION

PATENT NO.        : 6,998,890 B2
APPLICATION NO. : 10/813394
DATED              : February 14, 2006
INVENTOR(S)      : Shyng Guan Chen It is certified that error appears in the above-identified patent and that said Letters Patent is hereby corrected as shown below:

Column 7,
Line 24, change "counts" to -- count --.
Line 25, change "provides" to -- provide --.
Line 26, change "signals" to -- signal --.
Line 31, change "narrows" to -- narrow --.
Lines 49 and 61, change "signals, after -- signal --.

Column 8,
Line 6, change "monitors" to -- monitor --.
Line 6, change "adjusts" to -- adjust --.
Line 15 insert "a" before the word "master".
Line 52, change "counts" to -- count --.
Line 53, change "provides" to -- provide --.
Line 54, change "signals" to -- signal --.

Column 9,
Line 10, change "signals" to -- signal --.

Column 10,
Lines 3, 9 and 10, change "signals" to -- signal --.

Signed and Sealed this

Fifteenth Day of August, 2006

JON W. DUDAS
*Director of the United States Patent and Trademark Office*